(12) United States Patent
Jun et al.

(10) Patent No.: US 6,211,094 B1
(45) Date of Patent: Apr. 3, 2001

(54) THICKNESS CONTROL METHOD IN FABRICATION OF THIN-FILM LAYERS IN SEMICONDUCTOR DEVICES

(75) Inventors: Kyoung-Shik Jun; Young-Chul Jang; Bong-Su Cho, all of Kyonggido (KR)

(73) Assignee: Samsung Electronics Co., Ltd., Kyonggi-do (KR)

( * ) Notice: Subject to any disclaimer, the term of this patent is extended or adjusted under 35 U.S.C. 154(b) by 0 days.

(21) Appl. No.: 09/379,565

(22) Filed: Aug. 23, 1999

(30) Foreign Application Priority Data

Sep. 15, 1998 (KR) .................................................. 98-38026

(51) Int. Cl.[7] .................................................. H01L 21/66
(52) U.S. Cl. .............................................. 438/758; 438/14
(58) Field of Search ..................... 438/14, 758; 427/585, 427/587, 588, 99

(56) References Cited

U.S. PATENT DOCUMENTS 3,627,569 * 12/1971 Beecham .
5,131,752 * 7/1992 Yu et al. .
5,318,632 * 6/1994 Onodera .
5,800,616 * 9/1998 Persyn .
6,054,181 * 4/2000 Nanbu et al. .

* cited by examiner

Primary Examiner—Charles Bowers
Assistant Examiner—Evan Pert
(74) Attorney, Agent, or Firm—Skjerven Morrill MacPherson LLP; David Millers

(57) ABSTRACT

A method of controlling thicknesses of thin film layers in manufacturing semiconductor devices begins with loading monitoring wafers in a thin film forming apparatus. The apparatus has multiple film formation zones, and one of the zones is a reference zone. After forming thin films on the monitoring wafers, thicknesses of the thin films formed on the monitoring wafers are measured. Then, process time and process temperatures are adjusted so that the thicknesses of films are the same as a target film thickness. Finally, thin films are formed on semiconductor wafers using the adjusted process time and temperatures.

19 Claims, 8 Drawing Sheets

THICKNESS CONTROL METHOD IN FABRICATION OF THIN-FILM LAYERS IN SEMICONDUCTOR DEVICES

BACKGROUND OF THE INVENTION

1. Field of the Invention

The present invention relates to manufacturing of a semiconductor device, and more particularly to controlling the thickness of a thin film layer in the device.

2. Description of the Related Art

Manufacturing of semiconductor devices typically includes forming N or P-type regions in a semiconductor substrate by doping various impurities into the substrate, and forming various thin film layers on the substrate. Several different chemical vapor deposition (CVD) methods can form thin films. Low pressure chemical vapor deposition (LPCVD) is one of the CVD methods.

Typically, LPCVD does not require high temperature and a high pressure in forming a thin film layer. For instance, the pressure range of LPCVD processes is generally between 0.1 torr and 100 torr. LPCVD can form most thin film layers of a semiconductor device, for example, an oxide film, a polysilicon film, a tungsten film, a silicide film, a nitride film, and an epitaxial film. Further, LPCVD can form a thin film layer that has small number of particles and a good step coverage.

A typical apparatus for performing the LPCVD includes a bell-shaped outer tube, an inner tube in the interior of the outer tube, a gas supply system connected to the inner tube, a gas exhaust system connected to the outer tube, a wafer boat elevator that moves a wafer boat to and from the inner tube, and an electric furnace that is around the outer tube to maintain the process temperature in the apparatus.

In forming a thin film layer of a semiconductor device using the above-described apparatus, process conditions, such as deposition time, process temperature, and density of the gas, determine the thickness of the thin film layer. To obtain a thin film layer with a desired thickness, a monitoring wafer is loaded in the inner tube with other wafers, and the thickness of a thin film layer on the monitoring wafer is measured. Based on the measured thickness, the deposition time in a subsequent process can be adjusted to produce a thin film layer with the desired thickness.

However, the monitoring wafer measurements only control the deposition time in achieving a thin film layer with a desired thickness. However, process temperature is also a critical factor that determines the thickness of the thin film layer, and a temperature gradient in the processing apparatus can cause film thicknesses to vary from wafer to wafer. Thus, an effective monitoring of both the process temperature and the deposition time can promote the formation of a thin film layer with a uniform thickness.

SUMMARY OF THE INVENTION

An embodiment of the present invention provides a method of controlling thicknesses of thin film layers in manufacturing semiconductor devices. The method includes: loading monitoring wafers in a thin film forming apparatus, wherein the apparatus includes multiple zones, one of the zones being a reference zone; forming thin films on the monitoring wafers using a first process time and a first set of process temperatures for the zones; measuring thicknesses of the thin films formed on the monitoring wafers; determining a second process time expected to provide in the reference zone a thin film with a target film thickness; and determining a second set of process temperatures for the zones. The second set of process temperatures improves the uniformity of thicknesses of films formed in the various zones. The thin films formed on semiconductor wafers using the second process time and the second set of process temperatures can be measured for further refinements of the processing time and temperature.

BRIEF DESCRIPTION OF THE DRAWINGS

The features and advantages of the present invention will become more apparent by describing specific embodiments of the invention with reference to the accompanying drawings, in which.

DETAILED DESCRIPTION OF THE PREFERRED EMBODIMENTS

Figure 1:
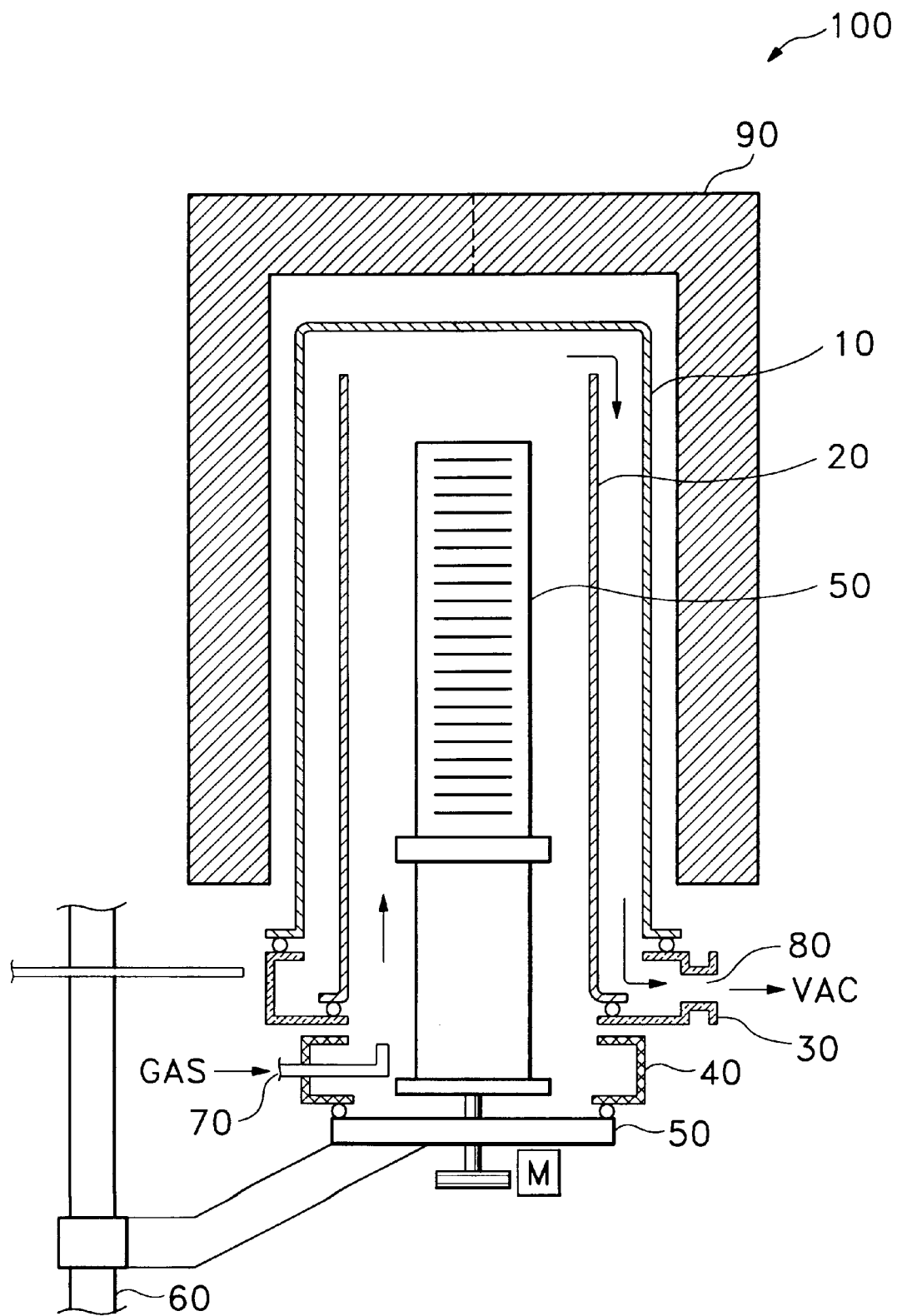
FIG. 1 illustrates an embodiment of a low-pressure chemical vapor deposition apparatus for forming a thin film according to an embodiment of the present invention.

FIG. 1 shows an LPCVD apparatus 100. Apparatus 100 includes a cylindrical outer tube 10, a cylindrical inner tube 20, a first supporting frame 30, a second supporting frame 40, a wafer boat 50, and a boat elevator 60. Both tubes 10 and 20 are made of quartz. Outer tube 10 has an open end at the bottom, and inner tube 20 has open ends at the top and bottom. The diameter of outer tube 10 is greater than that of inner tube 20, and inner tube 20 is within outer tube 10. First supporting frame 30 supports tubes 10 and 20, and second supporting frame 40 supports first supporting frame 30.

For LPCVD, semiconductor wafers (not shown) are in wafer boat 50, and boat elevator 60 loads wafer boat 50 to inner tube 20. A gas injection nozzle 70 in second supporting frame 40 supplies a reaction gas into inner tube 20, and an exhaust port 80 in first supporting frame 30 exhausts the residual and waste gas discharged from inner tube 20 through outer tube 10. An electric furnace 90 around outer tube 10 controls the temperature inside inner tube 20 so that inner tube 20 has desired temperature and temperature gradient across the interior of inner tube 20.

Figure 2:
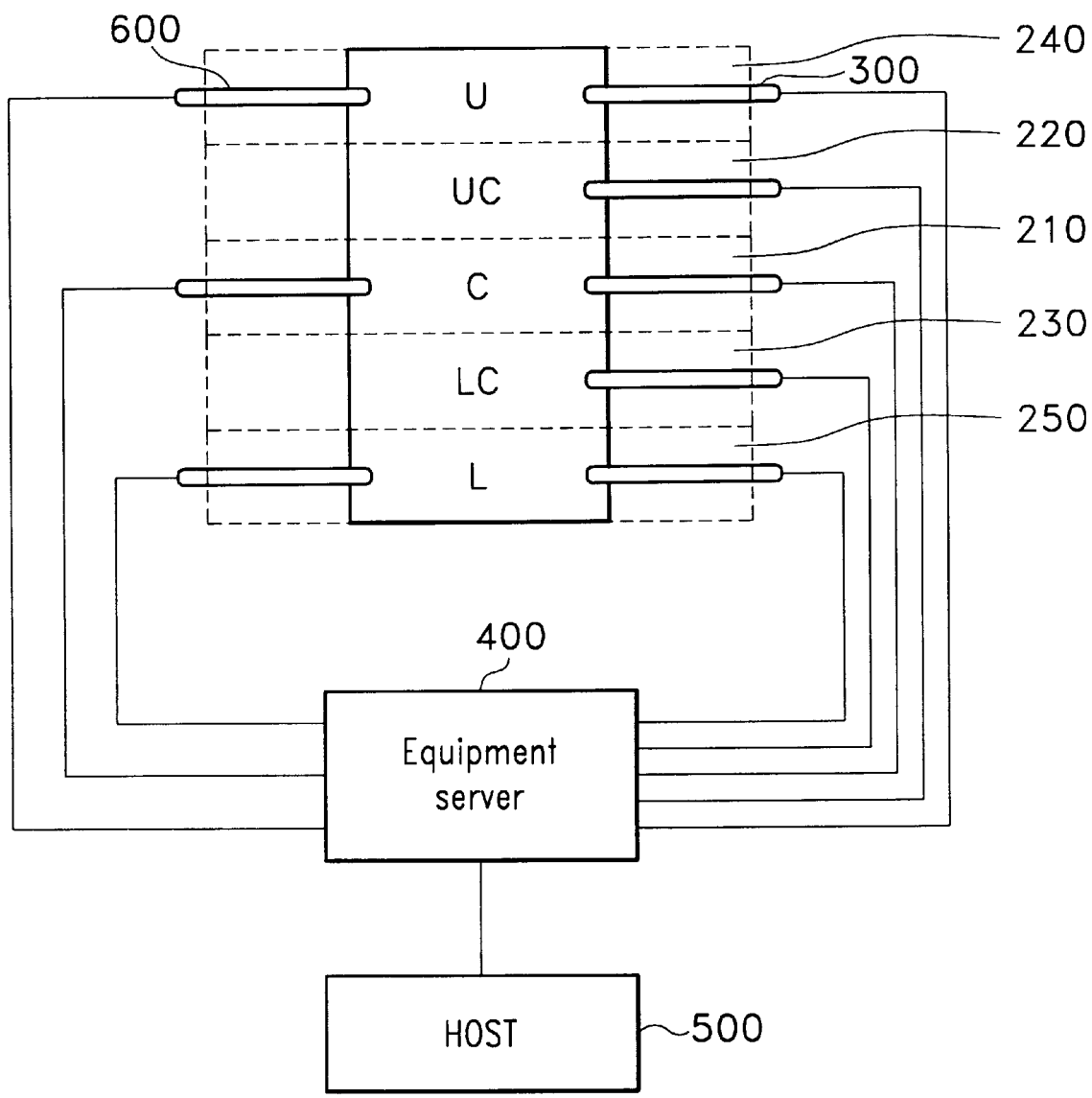
FIG. 2 illustrates a furnace, a temperature measuring unit, and a reaction gas measuring unit, which are divided according to an embodiment of the present invention.

FIG. 2 shows a process monitoring system in accordance with an embodiment of the present invention. The process monitoring system includes inner tube 20, which is divided into a center zone 210, an upper center zone 220, a lower center zone 230, an upper zone 240, and a lower zone 250. Center zone 210 is used as a reference zone as described further below.

A process temperature measuring unit 300 includes thermocouples or other devices, which are in zones 210 to 250 and measure the temperatures of zones 210 to 250. Temperature measuring unit 300 sends measured temperatures to an equipment server 400. Equipment server 400 compares the measured temperatures with reference temperatures that a host 500 provides. Equipment server 400 then controls furnace 90 to adjust the temperatures within inner tube 20, particularly within wafer boat 50.

The density of the reaction gas within inner tube so affects the thickness of thin film layers being formed on the wafers. Accordingly, a reaction gas density measuring unit 600 in zones 210, 240, and 250 measures reaction gas density within inner tube 20. In apparatus 100, because gas injection nozzle 70 is under inner tube 50, lower zone 250 may have the highest reaction gas density, and upper zone 240 may have the lowest reaction gas density. Reaction gas density measuring unit 600 sends the measured reaction gas densities to equipment server 400. Equipment server 400 compares the measured densities with reference densities from host 500, and controls the supply of the reaction gas to adjust the reaction gas densities within inner tube 20.

Figure 3:
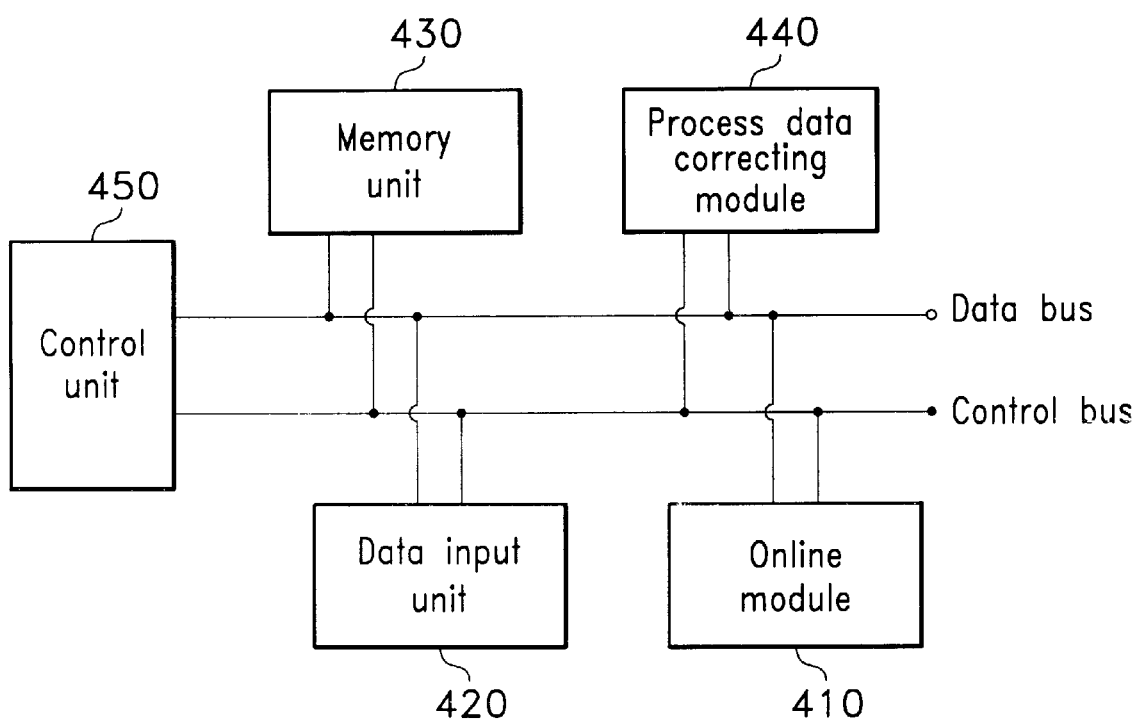
FIG. 3 is a block diagram of an equipment server for the system of FIG. 2.

FIG. 3 is a block diagram of equipment server 400 of FIG. 2. Equipment server 400 includes an on-line module 410, a memory unit 430, a data input unit 420, a process data correcting module 440, and a control unit 450. On-line module 410 connects to host 500 to receive data from host 500. The measured temperatures and densities and the downloaded reference temperatures and densities are stored in memory unit 430. Data input unit 420 is, for example, a keyboard or a keypad, that permits manual entry of information in memory unit 430.

Process data correcting module 440 executes programs that calculate a deposition time, a process temperature, and a reaction gas density to make process adjustments within inner tube 20 (FIG. 1). Process data correcting module 440 may include a read only memory (ROM) for the programs, and memory unit 430 may include a random access memory (RAM) for the stored data that process data correcting module 440 uses. Alternative processing architectures can also be used.

In accordance with an embodiment of the invention, monitoring wafers are loaded in zones 210 to 250 with other semiconductor wafers, and processed to form thin films while the temperature and density data are determined as described. The thicknesses of the thin films on the monitoring wafers are measured, and process data correcting module 440 uses those measurements to calculate a deposition time, a process temperature, and a reaction gas density for the next thin film formation process. Loading and using monitoring wafers solely for measurement of the film thickness reduces the number of wafers that can be simultaneously process and causes a degradation of the process productivity and increased processing cost. Accordingly, instead of loading monitoring wafers in every zone 210 to 250, monitoring wafers are loaded in zones selected from among zones 210 to 250. For example, one monitor wafer can be loaded into each of zones 210, 240, and 250. Each of zones 210 to 250 contains multiple semiconductor wafers being processed.

Figure 4A:
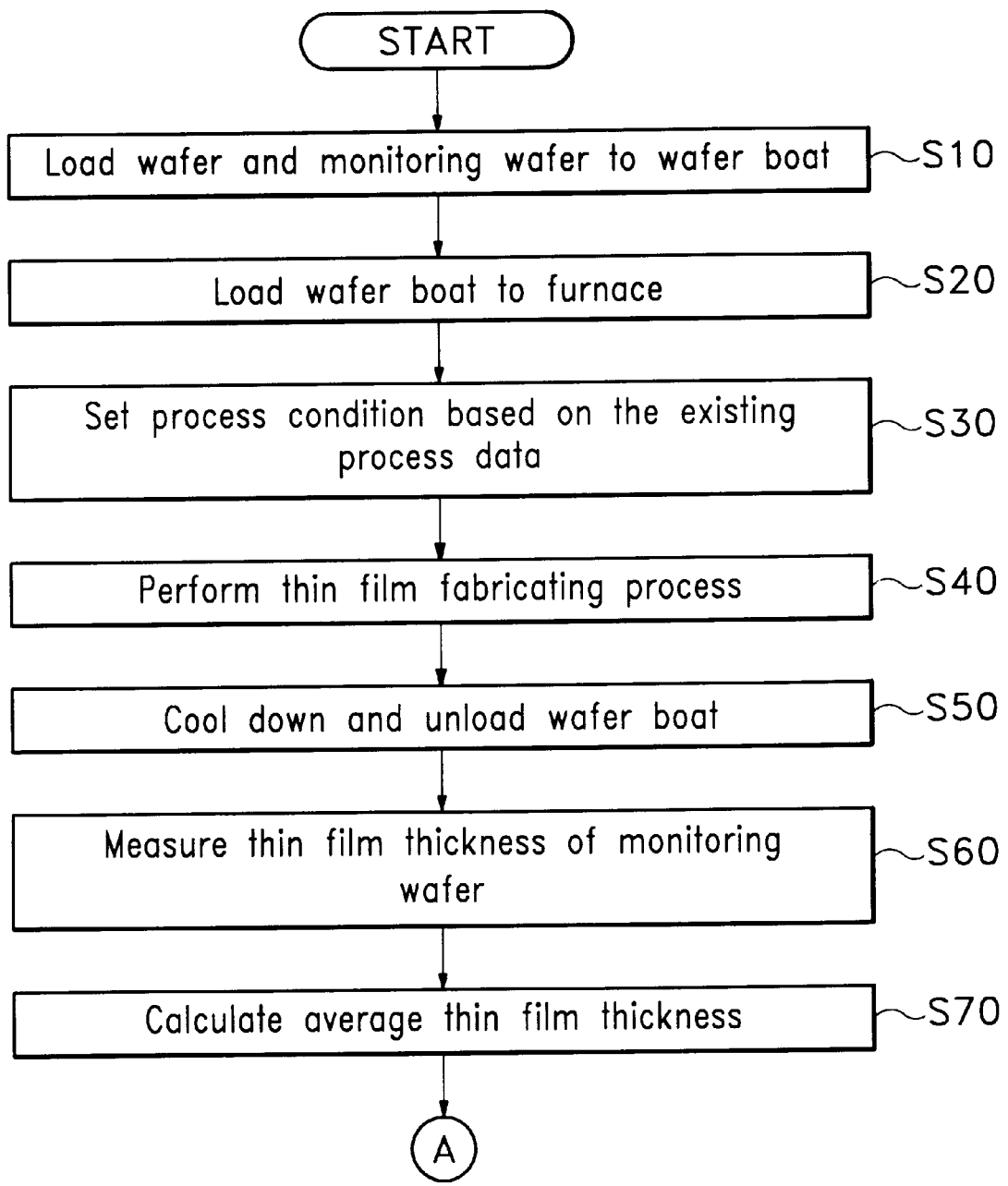
FIGS. 4A and 4B form a flow chart illustrating a film thickness control method in accordance with another embodiment of the present invention.
Figure 4B:
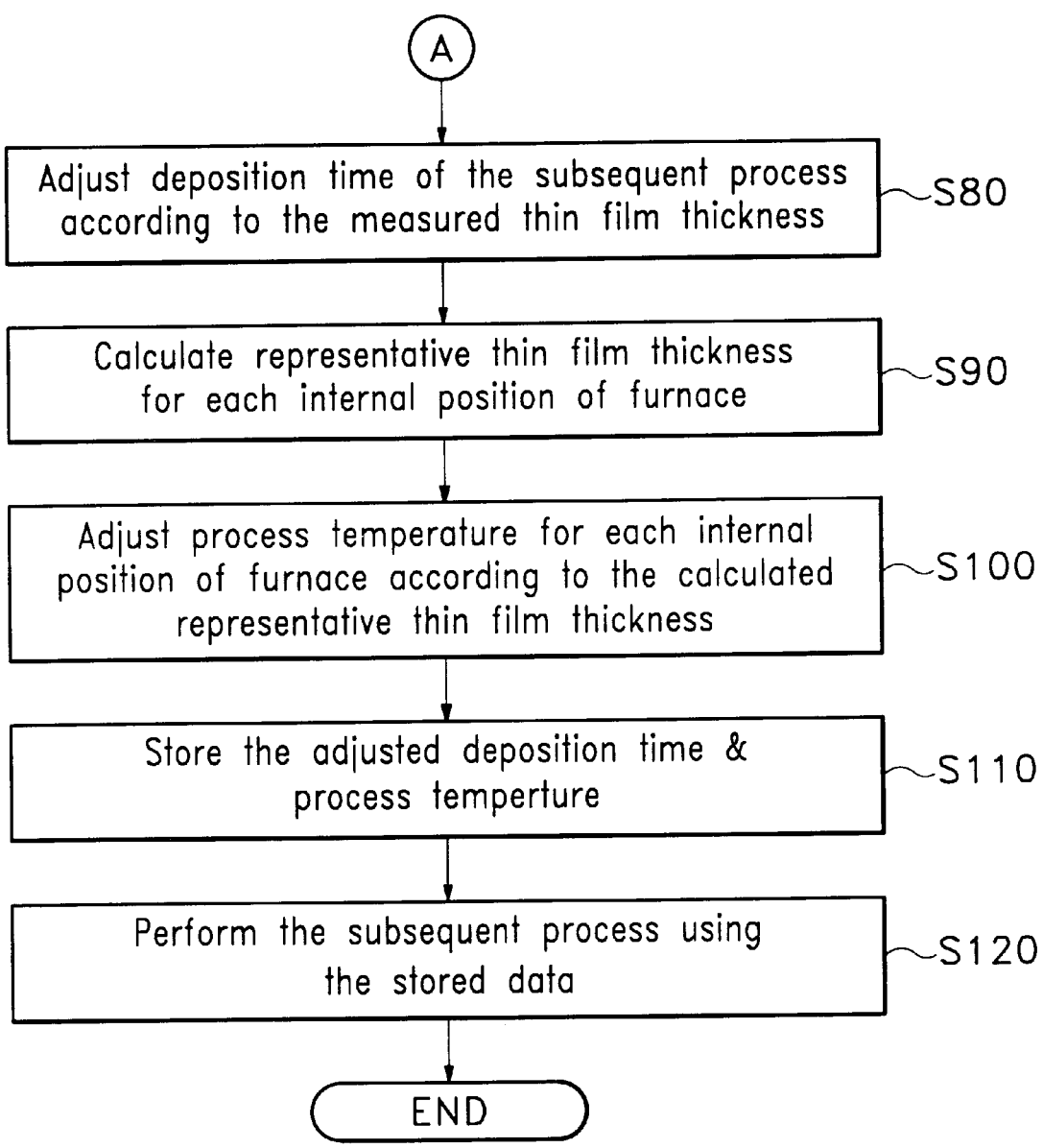

FIGS. 4A and 4B illustrate a method for controlling a thin film layer formation using monitoring wafers in accordance with an embodiment of the invention.

Figure 5:
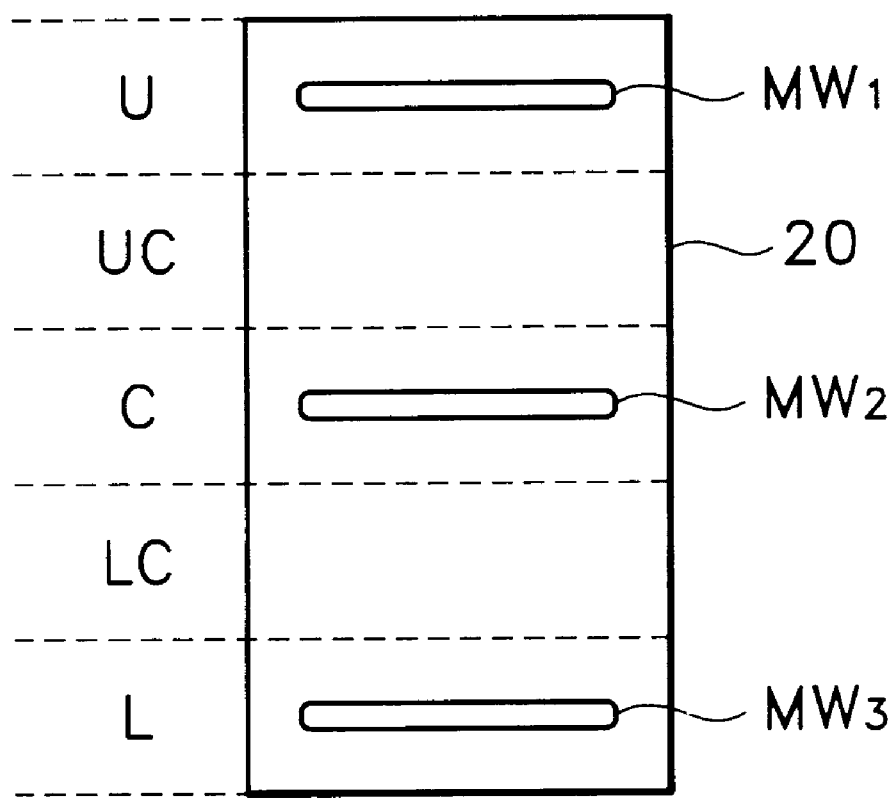
FIG. 5 illustrates an embodiment of the present invention where three monitoring wafers are employed to control the film thickness.

Referring to FIGS. 1, 2, 3, 4A and 4B, in step S10, monitoring wafers MW1, MW2, and MW3 are respectively loaded to slots of wafer boat 50 in center zone 210, upper zone 240, and lower zone 250, as shown in FIG. 5. Semiconductor wafers to be processed are also loaded into zones 210 to 250. In step S20, equipment server 400 drives boat elevator 60 to load wafer boat 50 into inner tube 20 of apparatus 100.

In step S30, equipment server 400 sets LPCVD process conditions, such as process temperature and quantity of reaction gas to be supplied. The selected process parameters are according to reference data from host 500, measurements found for conditions used in prior thin film formation process. Then, step S40 performs LPCVD to form thin film layers on the semiconductor wafers and monitoring wafers MW1, MW2, and MW3.

Figure 6:
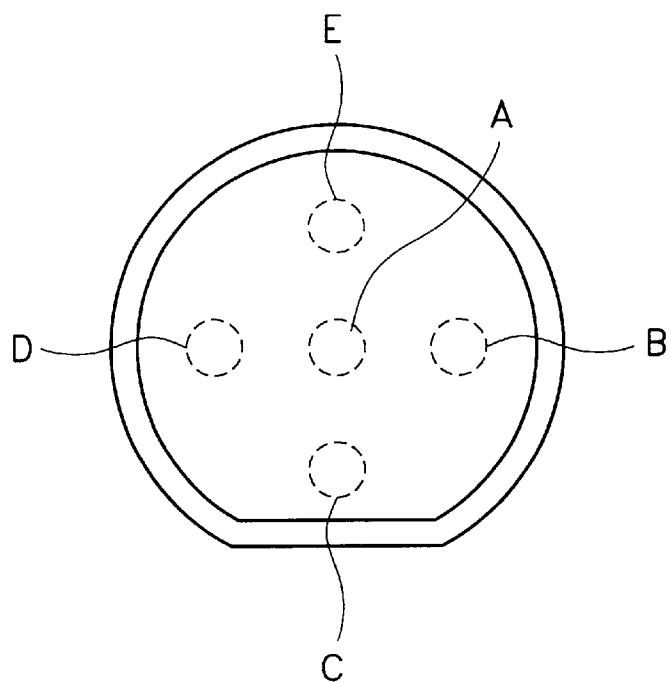
FIG. 6 is a plan view of a monitoring wafer illustrating the spots for film thickness measurements.

In step S50, equipment server 400 causes boat elevator 60 to unload wafer boat 50 from inner tube 20 after the thin film formation is complete. In step S60, monitoring wafers MW1, MW2, and MW3 are cooled, removed from wafer boat 50 and transferred to measuring equipment (not shown) for measurements of the film thicknesses. The thicknesses of thin films are measured at multiple measuring spots on each monitoring wafer MW1, MW2, or MW3 because the thickness varies even on a single wafer. As an example shown in FIG. 6, the thickness of each monitoring wafer is measured at five spots A, B, C, D, and E.

Step S70 determines an average film thickness for each monitoring wafer MW1, MW2, and MW3. For accuracy, the greatest and the least of the measured thicknesses are omitted from the average. As shown in Equation 1, the remaining measurements for a monitoring wafer are added and divided by the number of measurements, to thereby obtain an average film thickness.

$$TH_{MW} = \frac{X_1 + X_2 + X_3}{\text{number of measurements}} \quad \text{Equation 1}$$

Wherein, $TH_{MW}$ is the average film thickness of a monitoring wafer MW1, MW2, or MW3; $X_1$, $X_2$, and $X_3$ are the measured film thicknesses. The highest and lowest measured thicknesses $X_4$ and $X_5$, are excluded from use in average. The "number of measurements" is three here.

Table 1 contains example data illustrating measured thicknesses and the determination average thicknesses.

TABLE 1

| | A | B | C | D | E | Ave. I |
|---|---|---|---|---|---|---|
| MW1 | 1556Å | 157Å | 150Å | 163Å | 167Å | 158.4Å |
| MW2 | 157Å | 159Å | 155Å | 159Å | 163Å | 158.6Å |
| MW3 | 160Å | 161Å | 162Å | 164Å | 166Å | 162.6Å |
| average II | 157.3Å | 159Å | 155.7Å | 162Å | 165Å | |

*Target film thickness is 160Å

In Table 1, A to E denote five measuring spots on monitoring wafers MW1, MW2, and MW3. Average I denotes average thin film thicknesses of each monitoring wafers MW1, MW2, and MW3, and average II denotes average thin film thicknesses at each of measuring spots A to E. Process data correcting module 440 of equipment server 400 performs step S70, and the data in Table 1 is stored in memory unit 430 of equipment server 400.

Figure 7:
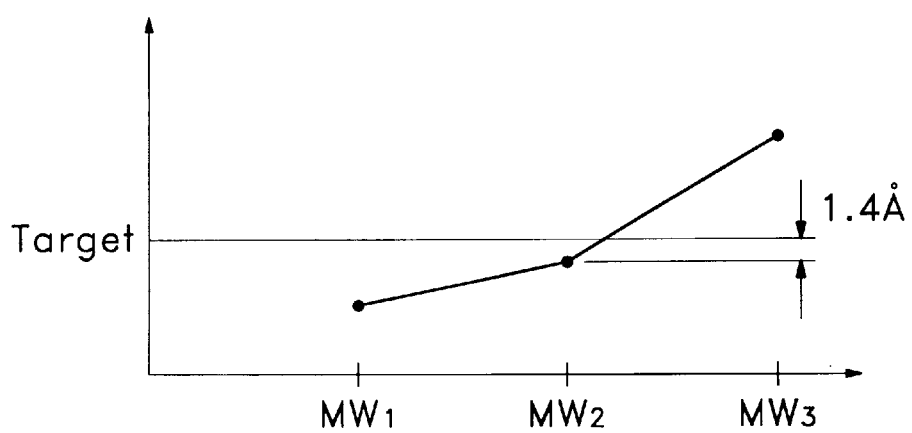
FIG. 7 is a graph showing average film thicknesses determined in step S70 of FIG. 4A.

The averages I from Table 1 are shown as a graph in FIG. 7. The averages for monitoring wafers MW1, MW2, and MW3 respectively in upper, center, and lower zones 240, 210, and 250 are 1.6 Å, 1.4 Å, and 2.6 Å away from a target film thickness 160 Å. The thin film thickness of monitoring wafer MW2 in center zone 210 is the closest to the target film thickness, 160 Å, among three monitoring wafers MW1, MW2, and MW3. As mentioned above, center zone 210 is the reference zone.

In step S80 (FIG. 4B), the process time (or deposition time) for next LPCVD is adjusted so that average thin film thickness of monitoring wafer MW2 in reference zone 210 will be the same as or at closer to the target thin film thickness, in this embodiment 160 Å. The process time is calculated by Equation 2.

$$Depotime(n+1) = Depotime(n) + \frac{TH_{target} - TH_{MW2}}{GainDepo(n)} \quad \text{Equation 2}$$

$TH_{MW2}$ is the average thin film thickness of monitoring wafer MW2 in reference zone 210, and $TH_{target}$ is the target film thickness. GainDepo is the film thickness deposited onto monitoring wafer MW2 per unit time, i.e., deposition thickness (Å)/unit time (sec), and can be empirically obtained after several deposition processes are performed. Depotime(n+1) is the process time for the next LPCVD, and Depotime(n) is the previous LPCVD process time.

For example, if the previous deposition time Depotime(n) is 1830 sec, the target film thickness is 160 Å, the average film thickness of monitoring wafer MW2 is 158.6 Å as shown in Table 1, and the GainDepo(n) is 1.8 Å/sec, the adjusted deposition time Depotime(n+1) is 1830 seconds+ [(160–158.6)/1.8] or 1830.78 seconds. Accordingly, 0.78 second deposition time is added to the previous deposition time for next LPCVD. However, the deposition time adjustment according to Equation 2 may cause a drastic change in the thin film thickness. Accordingly, the deposition time can be adjusted only by approximately 70% of the difference between Depotime(n+1) and Depotime(n) calculated from Equation 2.

Referring to Table 1, increasing the deposition time so that monitoring wafer MW2 in center zone 210 will have the target thickness increases the deviation between the target thickness and the thickness of films that from on wafers in zone 250. For example, while the adjusted process time may increase the average thin film thickness of monitoring wafer MW1 from 158.6 Å to 160 Å, the average thin film thickness of monitoring wafer MW3 may increase from 162.6 Å to 164 Å. However, the film thicknesses of monitoring wafers MW1 and MW3 can be adjusted by changing process temperature (deposition temperature).

Accordingly, in step S90, the process temperatures in zones 220, 230, 240 and 250 are determined for next LPCVD. First, representative film thicknesses in upper and lower zone 240 and 250 are calculated using Equations 3 and 4. Representative film thickness in upper zone 240 is calculated by adding the increase of the average thin film thickness of monitoring wafer MW2 cause by the deposition time adjustment to the average thin film thickness of monitoring wafer MW1.

$$TH_u = TH_{MW1} + (TH_{target} - TH_{MW2}) \quad \text{Equation 3}$$

$TH_U$ is the representative film thickness in upper zone 240, $TH_{MW1}$ is the average measured film thickness in upper zone 240, $TH_{target}$ is the target film thickness, and $TH_{MW2}$ is the average measured film thickness in the reference zone 210. For example, if the data of Table 1 is used, $TH_U$=158.4 Å+(160 Å–158.6 Å)=159.8 Å.

$$TH_L = TH_{MW3} + (TH_{target} - TH_{MW2}) \quad \text{Equation 4}$$

Representative film thickness $TH_L$ in lower zone 250 is calculated by adding the increase of the average thin film thickness of monitoring wafer MW2 cause by the deposition time adjustment to the average thin film thickness of monitoring wafer MW3. For example, $TH_L$=162.6 Å+(160 Å–158.6 Å)=164 Å

After the calculation of the representative film thicknesses in upper and lower zones 240 and 250, representative film thicknesses in upper center and lower center zones 220 and 230 are calculated according to Equations 5 and 6.

$$TH_{UC} = \frac{TH_{MW1} + TH_{MW2}}{2} + (TH_{target} - TH_{MW2}) \quad \text{Equation 5}$$

$$TH_{LC} = \frac{TH_{MW2} + TH_{MW3}}{2} + (TH_{target} - TH_{MW2}) \quad \text{Equation 6}$$

$TH_{UC}$ and $TH_{LC}$ are representative film thicknesses in zones 220 and 230. Although zones 220 and 230 do not include monitoring wafers, $TH_{UC}$ and $TH_{LC}$ are calculated assuming that the average film thickness changes linearly between two average film thicknesses calculated from the monitoring wafers. Accordingly, representative film thickness $TH_{UC}$ in zone 220 is determined by interpolating between the average of the film thicknesses of monitoring wafers MW1 and MW2 and adding the film thickness increase in reference zone 210 due to the process time adjustment. In this embodiment, $TH_{UC}$={158.4 Å+158.6 Å)/2}+(160 Å–158.6 Å)=159.9 Å.

Similarly, representative film thickness $TH_{LC}$ in zone 230 is calculated by calculating the average of the film thicknesses of monitoring wafers MW2 and MW3, and adding the film thickness increase in reference zone 210 due to the process time adjustment. In this embodiment, $TH_{CL}$={(158.6 Å+162.6 Å)/2}+(160 Å–158.6 Å)=162 Å.

Figure 8:
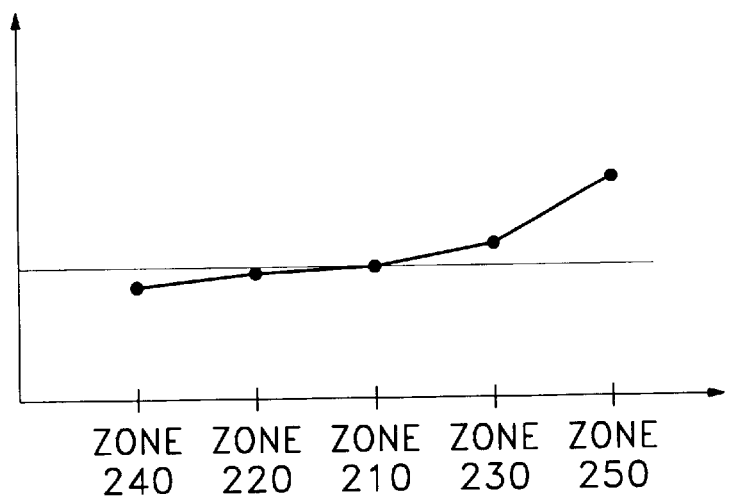
FIG. 8 is a graph showing representative film thicknesses determined in step S90 of FIG. 4B.

Process data correcting module 440 of equipment server 400 performs step S90. FIG. 8 graphically shows the representative film thicknesses in zones 210 to 250 based on the data from Table 1. Referring to FIG. 8, the film thickness in center zone 210 becomes the same as the target film thickness after the process time adjustment. However, the film thicknesses in zones 220, 230, 240, and 250 still deviate from the target film thickness. Thus, these deviations in zones 220, 230, 240, and 250 are corrected in step S100.

Step S100 adjusts the process temperatures in zones 220, 230, 240, and 250 to produce thin films with the target thickness in zones 220, 230, 240, and 250. The process temperature in center zone 210 is not adjusted because the representative film thickness in zone 210 has been already adjusted by changing deposition time.

TABLE 2

| Zone | Process Temperature (° C.) |
|---|---|
| upper zone 240 | 900 |
| upper center zone 220 | 899 |
| center zone 210 | 897 |
| lower center zone 230 | 895 |
| lower zone 250 | 893 |

Table 2 shows exemplary process temperatures in zones 210 to 250 of the previous LPCVD. The process temperatures are stored in memory unit 430 of equipment server 400. The process temperatures gradually increase from lower zone 250 to upper zone 240.

The process temperatures in zones 220 and 230 can be adjusted first. The process temperatures in zones 220 and 230 are adjusted before the process temperatures in zones 240 and 250 are adjusted because the process temperature adjustments in zones 220 and 230 may affect the process temperature adjustments in zones 240 and 250.

$$TEMP_{UC}(n+1) = TEMP_{UC}(n) + \frac{TH_{target} - TH_{UC}}{Gain/Temp} \qquad \text{Equation 7}$$

Equation 7 gives adjusted temperature $TEMP_{UC}(n+1)$ in zone 220 for next LPCVD. In Equation 7, $TEMP_{UC}(n)$ is the previous process temperature in zone 220, 899° C. in Table 2. Gain/Temp is the change of film thickness according to process temperature change. Gain/Temp is determined from accumulated process data.

In accordance with Equation 7, the difference between representative film thickness $TH_{UC}$ in zone 220 and target film thickness $TH_{target}$ is divided by Gain/Temp. Then, addition of the difference divided by Gain/Temp to previous process temperature $TEMP_{UC}(n)$ in zone 220 produces adjusted temperature $TEMP_{UC}(n+1)$ in zone 220. For example, in this embodiment, if Gain/Temp is 1.8 (Å/° C.), process temperature $TEMP_{UC}(n+1)$ in zone 220 for next LPCVD is 899.055° C. [899° C.+{(160 Å–159.9 Å)/1.8 (Å/° C.)}].

$$TEMP_{UC}(n+1) = TEMP_{UC}(n) + \frac{TH_{target} - TH_{LC}}{Gain/Temp} \qquad \text{Equation 8}$$

Similarly, adjusted temperature $TEMP_{LC}(n+1)$ in zone 230 for next LPCVD is calculated according to Equation 8. Thus, $TEMP_{LC}(n+1)$ is 893.88° C. [895° C.+{(160Å–162Å)/1.8 Å/° C.}].

Since representative film thickness $TH_{LC}$ in zone 230 is thicker than the target film thickness by approximately 2 Å, the process temperature in zone 230 is lowered from 895° C. to 893.88° C. to produce thin films with the target film thickness.

Through the process temperature adjustments described above, the target film thickness can be achieved in zones 220 and 230. As can be seen in the above example, the adjusted process temperature of upper center zone 220, i.e., $TEMP_{UC}(n+1)$, is higher than the preceding process temperature by approximately 0.055° C., and the adjusted process temperature of lower center area 230 to be adjusted, i.e., $TEMP_{LC}(n+1)$ is lower than the preceding process temperature by approximately 1.12° C. After determining the process temperatures for upper center zone 220 and lower center zone 230, the process temperatures in zones 240 and 250 for the next LPCVD are calculated.

However, since zones 220, 230, 240, and 250 are not physically isolated from each other, the process temperature change in zones 220 and 230 affect the temperatures and film thicknesses for zones 240 and 250. Therefore, representative film thicknesses $TH_U$ and $TH_L$ in zones 240 and 250 are modified, and the modified representative film thicknesses $TH'_U$ and $TH'_L$ are used in calculating adjusted process temperatures $TEMP_U(n+1)$ $TEMP_L(n+1)$ for zones 240 and 250.

$$TH'_U = TH_U + C_U \times (TH_{target} - TH_{UC}) \qquad \text{Equation 9}$$

$$TEMP_U(n+1) = TEMP_U(n) + \frac{TH_{target} - TH'_U}{Gain/Temp} \qquad \text{Equation 10}$$

Equations 9 and 10 indicate adjusted process temperature $TEMP_U(n+1)$ in zone 240. $C_U$ is a coefficient that is determined empirically. For example, when the process temperature in zone 220 increases by 1° C., if the film thickness in zone 220 increases by 10 Å and the film thickness in zone 240 increases by 5 Å, coefficient $C_U$ in zone 240 is 5/10 (=0.5).

Referring to Equation 9, modified representative film thickness $TH'_U$ in zone 240 is obtained by multiplying the difference between representative film thickness $TH_{UC}$ in zone 220 and the target film thickness by coefficient $C_U$ and adding the product of the multiplication to representative film thickness $TH_U$ in zone 240. In this embodiment, modified representative film thickness $TH'_U$ in zone 240 is 159.85 Å[159.8 Å+{0.5×(160 Å–159.9 Å)}].

Then, Equation 10 indicates the adjusted process temperature $TEMP_U(n+1)$ in zone 240 in a way similar to Equations 7 and 8.

$$TEMP_U(n+1) = TEMP_U(n) + \frac{TH_{TARGET} - TH'_U}{gaintemp}$$

Equation 10 In this embodiment, adjusted process temperature $TEMP_U(n+1)$ in zone 240 for the next LPCVD is 900.083° C. [900° C. +{(160 Å–159.85 Å)/1.8}].

$$TH'_L = TH_L + C_L \times (TH_{target} - TH_{LC}) \qquad \text{Equation 11}$$

$$TEMP_L(n+1) = TEMP_L(n) + \frac{TH_{target} - TH'_L}{Gain/Temp} \qquad \text{Equation 12}$$

Equations 11 and 12 indicate adjusted process temperature $TEMP_L(n+1)$ in zone 250 in a way similar to Equations 9 and 10. $C_L$ is a coefficient that is determined empirically. For example, when the process temperature in zone 230 increases by 1° C., if the film thickness in zone 230 increases by 10 Å and the film thickness in zone 250 increases by 5 Å, coefficient $C_L$ in zone 250 is 5/10 (=0.5). In this embodiment, modified representative film thickness $TH'_L$ in zone 250 is 163 Å or [164 Å+{0.5 ×(160 Å–164 Å)}], and adjusted process temperature $TEMP_L(n+1)$ in zone 250 for the next LPCVD is 891.33° C. or [893° C.+{(160 Å–163 Å)/1.8}].

After process data correcting module 440 performs step S100 using Equations 7 to 12, step S110 stores the adjusted deposition times and the adjusted process temperatures in memory unit 430.

Figure 9:
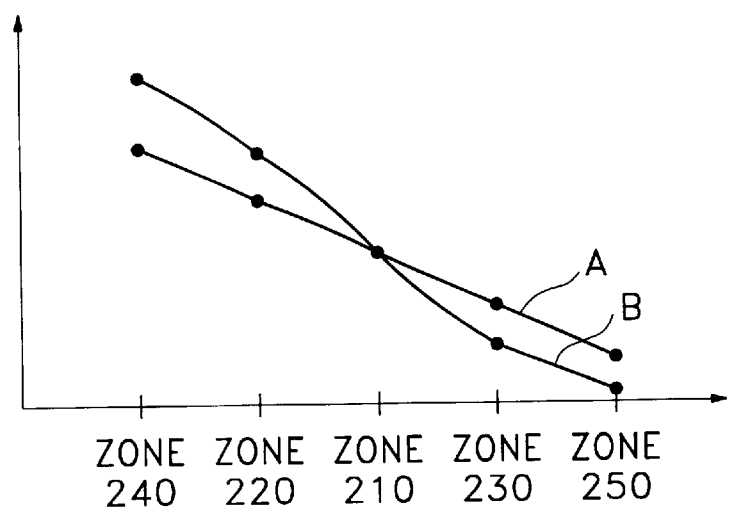
FIG. 9 is a graph showing process temperatures determined in step S100 of FIG. 4B.

FIG. 9 is a graphical representation of adjusted process temperatures determined above. Line A shows process temperatures in zones 210 to 250 before the adjustment is made, and line B shows process temperatures in zones 210 to 250 after the adjustment is made.

In step S120, control unit 450 of server 400 forms thin films on semiconductor wafers using the adjusted process times and temperatures stored in memory unit 430. The above-described monitoring process in FIGS. 4A and 4B can be repeated to achieve uniform thin film thickness in manufacturing semiconductor devices.

This invention has been described above with reference to the aforementioned embodiments. It is evident, however, that many alternative modifications and variations will be apparent to those having skill in the art in light of the foregoing description. Accordingly, the present invention embraces all such alternative modifications and variations that fall within the spirit and scope of the appended claims.

What is claimed is:

1. A thin film thickness control method in a process of fabricating a thin film-layer semiconductor, said method comprising:

(a) dividing an interior of a furnace where a thin film fabricating process is performed, into a plurality of zones, loading a plurality of monitoring wafers into said zones, and performing a thin film fabricating process on said monitoring wafers according to a previously determined deposition time period and a previously determined process temperature;

(b) calculating average film thicknesses on the monitoring wafers for which the fabricating process is completed and storing the calculated average film thicknesses into a memory, and calculating a corrected deposition time period using a deposition time period correcting equation, the equation predicting that the average film thickness of the monitoring wafer in a reference zone among the plurality of zones will have a target film thickness if process for the corrected deposition time period, and storing the corrected deposition time period into said memory;

(c) calculating a representative film thickness in each zone, respectively, using a representative film thickness correcting equation, the representative film thickness corresponding to a state where the corrected deposition time period is applied;

(d) calculating a process temperature using the representative film thickness and a process temperature correcting equation, and storing the calculated process temperature into said memory; and (f) performing the thin film fabricating process using the corrected deposition time period and the corrected process temperature stored in said memory.

2. The method according to claim 1, wherein:

said plurality of zones include a center zone positioned in a center of said interior of the furnace, an upper center zone and a lower center zone respectively positioned above and below said center zone, and an upper zone and a lower zone respectively positioned above said upper center zone and below said lower center zone; and said plurality of monitoring wafers are loaded respectively into said center, upper, and lower zones.

3. The method according to claim 2, wherein step (b) further comprises:

measuring a film thickness of said monitoring wafer in said center zone at various positions and storing measured film thickness data into said memory; and averaging said film thickness data excluding thickness data having largest positive deviation and negative deviation from a median value of said film thickness data in an average film thickness calculating equation, and storing an average film thickness data into said memory.

4. The method according to claim 2, wherein said reference zone is said center zone, and said corrected deposition time period is corrected being based on an average film thickness of said center zone.

5. The method according to claim 4, wherein said step (b) further comprises:

calculating a correcting deposition time period by dividing a difference between an average film thickness of said monitoring wafer in said center zone from a target film thickness by a deposition time period correcting coefficient; and summing up said correcting deposition time period and said previously determined deposition time period.

6. The method according to claim 5, wherein said deposition time period correcting coefficient is obtained by dividing said average film thickness of said monitoring wafer in said reference zone by said previously determined deposition time period.

7. The method according to claim 5, wherein said deposition time period correcting equation is: corrected deposition time period=previously determined deposition time period+{(target film thickness—average film thickness in said reference zone)/deposition time period correcting coefficient}.

8. The method according to claim 1, wherein:

for each zone containing one of said monitoring wafers, excluding said reference zone, a representative film thickness is obtained by summing said average film thickness of said monitoring wafer and a film thickness added by a process performed for said corrected deposition time period; and a representative film thickness in a zone not containing one of said monitoring wafers is obtained by interpolating said average film thicknesses of said zones having said monitoring wafers.

9. The method according to claim 8, wherein said step (d) further comprises:

calculating a correcting temperature of a first zone by applying a representative film thickness of said first zone which is adjacent to said reference zone to a first process temperature correcting equation;

correcting a representative film thickness of a second zone which is adjacent to said first zone using said representative film thickness correcting equation, considering said correcting temperature of said first zone; and calculating a correcting temperature of said second zone by applying said corrected representative film thickness to a second process temperature correcting equation.

10. The method according to claim 9, wherein said first zone comprises of an upper center zone and a lower center zone which are adjacent to said reference zone, and said second zone consists of an upper zone and a lower zone which are adjacent respectively to said upper center and lower center zones.

11. The method according to claim 9, wherein said first process temperature correcting equation is $$TEMPx(n+1)=TEMPx(n)+(THtarget-THx)/gaintemp$$

wherein, $TEMPx(n+1)$ denotes a corrected temperature of said first zone, $TEMPx(n)$ denotes said previously determined process temperature of said first zone, THtarget denotes said target film thickness, THx denotes a representative film thickness in said first zone, and gaintemp denotes a ratio of film thickness change to temperature change for said first zone.

12. The method according to claim 9, wherein said representative film thickness correcting equation is THy'= THy+Cy•(THtarget−THx).

wherein, THy denotes a representative film thickness of said first zone, Cy denotes a correcting coefficient, and THx denotes a film thickness of said second zone which is adjacent to said first zone.

13. The method according to claim 12, wherein said second process temperature correcting equation is $$TEMPy(n+1)=TEMPy(n)+(THtarget-THy)/gaintemp$$

wherein, $TEMPy(n+1)$ denotes a correcting temperature of said second zone, $TEMPy(n)$ denotes a previously determined process temperature of said second zone, THtarget denotes a target film thickness, THy' denotes a film thickness to be adjusted which is calculated by a representative film thickness correcting equation, and gaintemp denotes a ratio of change in film thickness to change in temperature for said second zone.

14. A method of controlling thicknesses of thin film layers in manufacturing semiconductor devices, said method comprising:

loading a plurality of monitoring wafers in a chamber of a thin film forming apparatus, the chamber including a plurality of zones, wherein one of the zones is a reference zone, and the reference zone contains one of the monitoring wafers;

forming thin films on the monitoring wafers using a first process time and a first set of process temperatures for the zones;

measuring thicknesses of the thin films formed on the monitoring wafers;

determining a second process time expected to form on a wafer in the reference zone, a film having a thickness closer to a target film thickness than the thickness measured on the monitoring wafer from the reference zone; and determining a second set of process temperatures for the zones, the second set of process temperatures being determined to form films having thicknesses close to the target film thickness.

15. The method of claim 14, further comprising forming thin films on semiconductor wafers using the second process time and the second set of process temperatures.

16. The method of claim 14, wherein measuring the thicknesses of the thin films formed on the monitoring wafers comprises:

measuring thicknesses of the thin films at a plurality of spots on each of the monitoring wafers; and determining an average thin film thickness for each of the monitoring wafers.

17. The method of claim 13, wherein determining the second process time comprises:

determining a difference between the target film thickness and the measured thin film thickness of the monitoring wafer in the reference zone; and adjusting the first process time so that the difference becomes zero.

18. The method of claim 17, wherein determining the second set of process temperatures comprises:

determining representative film thicknesses for monitoring wafers in the zones other than the reference zone by adding to each of the measured thin film thicknesses of the monitoring wafers in the zones other than the reference zone a change in thickness corresponding a change from the first processing time to the second processing time;

determining differences between the target film thickness and the representative film thicknesses of the monitoring wafer in the zones other than the reference zone; and adjusting the first set of process temperatures to reduce the differences.

19. The method of claim 18, further comprising determining a reference film thickness in a zone that does not contain one of the monitoring wafers, wherein for each zone not containing a monitoring wafer, the determining of the reference film thickness uses an interpolation of thicknesses measured for monitoring wafers in other zones.

* * * * *